United States Patent
Park

(10) Patent No.: US 9,305,893 B1
(45) Date of Patent: Apr. 5, 2016

(54) SEMICONDUCTOR PACKAGE HAVING OVERHANG PORTION AND METHOD FOR MANUFACTURING THE SAME

(71) Applicant: SK hynix Inc., Icheon-si, Gyeonggi-do (KR)

(72) Inventor: Jung Soo Park, Chungju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/704,399

(22) Filed: May 5, 2015

(30) Foreign Application Priority Data

Nov. 19, 2014 (KR) ........................ 10-2014-0161293

(51) Int. Cl.
| | | |
|---|---|---|
| *H01L 21/44* | (2006.01) | |
| *H01L 23/00* | (2006.01) | |
| *H01L 25/065* | (2006.01) | |
| *H01L 25/00* | (2006.01) | |

(52) U.S. Cl.
CPC ............ *H01L 24/48* (2013.01); *H01L 25/0657* (2013.01); *H01L 25/50* (2013.01); *H01L 2224/48105* (2013.01); *H01L 2224/48227* (2013.01); *H01L 2225/0651* (2013.01)

(58) Field of Classification Search
CPC ............... H01L 25/50; H01L 25/0657; H01L 25/06562; H01L 2224/85986; H01L 24/92; H01L 24/48
USPC .................................................. 438/617, 109
See application file for complete search history.

(56) References Cited

U.S. PATENT DOCUMENTS

| | | | | |
|---|---|---|---|---|
| 8,502,375 | B2* | 8/2013 | Liao ..................... | H01L 25/0657 257/724 |
| 2003/0137042 | A1* | 7/2003 | Mess ................... | H01L 23/3128 257/686 |
| 2008/0242076 | A1* | 10/2008 | Takiar ..................... | H01L 24/48 438/617 |
| 2009/0032969 | A1* | 2/2009 | Pilla ........................ | H01L 24/49 257/777 |
| 2011/0037158 | A1* | 2/2011 | Youn ........................ | H01L 23/50 257/686 |
| 2012/0001347 | A1* | 1/2012 | Lee .......................... | H01L 24/49 257/777 |
| 2012/0068306 | A1* | 3/2012 | Song ........................ | H01L 23/50 257/532 |
| 2013/0021760 | A1* | 1/2013 | Kim .................... | H01L 25/0657 361/729 |
| 2014/0264906 | A1* | 9/2014 | Fai ...................... | H01L 23/5384 257/774 |

FOREIGN PATENT DOCUMENTS

KR       1020060029925 A       4/2006

* cited by examiner

*Primary Examiner* — Nitin Parekh
(74) *Attorney, Agent, or Firm* — William Park & Associates Ltd.

(57) ABSTRACT

A method for manufacturing a semiconductor package includes disposing a structural body over one surface of a substrate formed with a plurality of bond fingers and a plurality of dummy bond fingers; forming an overhang portion by stacking a semiconductor chip formed with a plurality of bonding pads and a plurality of dummy bonding pads adjacent to one edge over the structural body such that the one edge projects out of a side surface of the structural body; forming a plurality of dummy wires which electrically couple the dummy bonding pads and the dummy bond fingers; and forming a plurality of conductive wires which electrically couple the bonding pads and the bond fingers after the dummy wires are formed.

11 Claims, 8 Drawing Sheets

SEMICONDUCTOR PACKAGE HAVING OVERHANG PORTION AND METHOD FOR MANUFACTURING THE SAME

CROSS-REFERENCES TO RELATED APPLICATION

The present application claims priority under 35 U.S.C. §119(a) to Korean Patent Application No. 10-2014-0161293, filed on Nov. 19, 2014, in the Korean Intellectual Property Office, which is incorporated herein by reference in its entirety.

BACKGROUND

1. Technical Field

Various embodiments generally relate to a semiconductor technology, and more particularly, to a semiconductor package having an overhang portion and a method for manufacturing the same.

2. Related Art

These days, the electronic industry trends to manufacture products at reduced costs with high reliability in such a way as to accomplish light weight, miniaturization, high speed operation, multi-functionality and high performance. A package assembly technology is considered as one of important technologies for achieving the purpose of designing such products.

The package assembly technology is to protect, from outside circumstances, a semiconductor chip having integrated circuits formed therein and to easily mount the semiconductor chip to a substrate so that operational reliability of the semiconductor chip can be secured. In the package assembly technology, as one of schemes for electrically connecting a semiconductor chip and a substrate, a wire bonding scheme in which the semiconductor chip and the substrate are electrically connected with each other using conductive wires is used.

SUMMARY

In an embodiment, a method for manufacturing a semiconductor package may include disposing a structural body over one surface of a substrate formed with a plurality of bond fingers and a plurality of dummy bond fingers. The method may also include forming an overhang portion by stacking a semiconductor chip formed with a plurality of bonding pads and a plurality of dummy bonding pads adjacent to one edge over the structural body such that the one edge projects out of a side surface of the structural body. Further, the method may include forming a plurality of dummy wires which electrically couple the dummy bonding pads and the dummy bond fingers. In addition, the method may include forming a plurality of conductive wires which electrically couple the bonding pads and the bond fingers after the dummy wires are formed.

In an embodiment, a semiconductor package may include a substrate having a plurality of bond fingers and a plurality of dummy bond fingers on one surface. The semiconductor package may also include a structural body disposed over the one surface. The semiconductor package may also include a semiconductor chip stacked over the structural body, and having an overhang portion which projects out of a side surface of the structural body. The semiconductor package may also include a plurality of bonding pads and a plurality of dummy bonding pads configured on the overhang portion. The semiconductor package may also include a plurality of dummy wires electrically coupling the dummy bonding pads and the dummy bond fingers. Further, the semiconductor package may also include a plurality of conductive wires electrically coupling the bonding pads and the bond fingers.

DETAILED DESCRIPTION

Hereinafter, a semiconductor package having an overhang portion and a method for manufacturing the same will be described below with reference to the accompanying figures through various embodiments.

Figure 1:
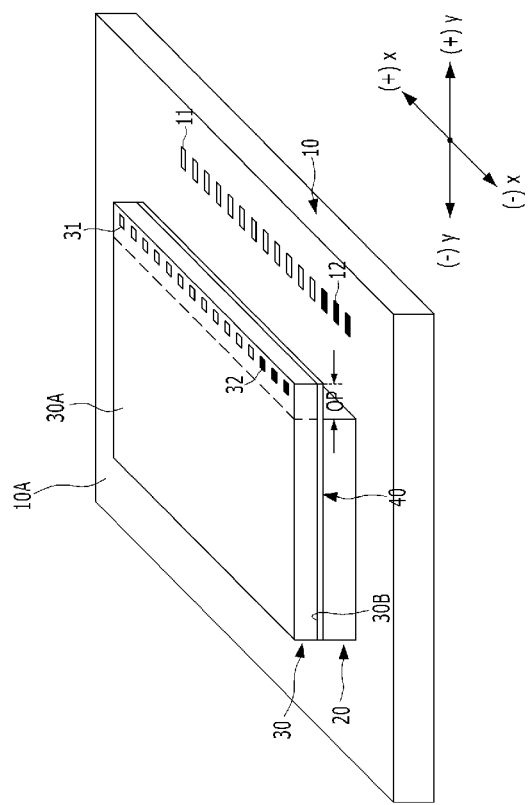
FIGS. 1 to 3 are perspective views illustrating a representation of an example of a semiconductor package in accordance with an embodiment, according to manufacturing order.

Referring to FIG. 1, a substrate 10, in which a plurality of bond fingers 11 and a plurality of dummy bond fingers 12 are formed on one surface 10A is prepared.

The substrate 10 may be a printed circuit board (PCB). The bond fingers 11 of the substrate 10 may include one or more bond fingers for data, more bond fingers for address, one or more bond fingers for clock signal, one or more bond fingers for control signal, one or more bond fingers for a power supply voltage, one or more bond fingers for a ground voltage, and so forth. Each of the dummy bond fingers 12 may be electrically coupled with any one of the bond fingers for a power supply voltage and the bond fingers for a ground voltage. Each of the dummy bond fingers 12 may also be supplied with a power supply voltage or a ground voltage from the bond fingers for a power supply voltage or the bond fingers for a ground voltage. The dummy bond fingers 12 may not be electrically coupled with the bond fingers 11, and be electrically floated.

While not shown, a plurality of electrode pads may be formed on the other surface of the substrate 10 which faces away from the one surface 10A. The substrate 10 may include circuit wiring lines which electrically couple the bond fingers 11 formed on the one surface 10A and the electrode pads formed on the other surface.

Although an embodiment illustrates an example in which the substrate 10 is constructed by a printed circuit board, it is to be noted that the technical sprit of the embodiment is not limited to such an example. For example, the substrate 10 may be any one of a lead frame, a flexible substrate and an interposer.

A structural body 20 is disposed on the one surface 10A of the substrate 10.

The structural body 20 may be at least any one of an insulator such as a solder resist film, a semiconductor chip and a dummy chip. In an embodiment, it is illustrated that the structural body 20 is constructed by a solder resist film.

While not shown, where the structural body 20 is a semiconductor chip, the semiconductor chip may be electrically coupled with the substrate 10. In order for an electrical coupling with the substrate 10, the semiconductor chip may have a plurality of bumps on the front surface on which bonding pads are disposed. Further, the semiconductor chip may be flip chip-bonded onto the one surface 10A of the substrate 10 by the medium of the bumps. The semiconductor chip may be attached onto the one surface 10A of the substrate 10 by the medium of an adhesive member. The semiconductor chip may also be electrically coupled with the substrate 10 by the medium of conductive wires. Where the structural body 20 is a dummy chip, the dummy chip may be attached onto the one surface 10A of the substrate 10 by the medium of an adhesive member.

A back surface 30B of a semiconductor chip 30, which is formed with a plurality of bonding pads 31 and a plurality of dummy bonding pads 32 adjacent to one edge on a front surface 30A thereof, is attached onto the structural body 20 by the medium of an adhesive member 40 such that one edge portion of the semiconductor chip 30 projects out of a side surface of the structural body 20 in the (+)y direction defined in FIG. 1. Below, the one edge portion of the semiconductor chip 30 which projects out of the side surface of the structural body 20 will be defined as an overhang portion OP.

A circuit block configured by an integrated circuit, in which individual elements, such as transistors, resistors, capacitors, fuses, and so forth, necessary for the operation of a chip are electrically coupled with one another, may be formed in the semiconductor chip 30. The bonding pads 31 as the external contacts of the circuit block for electrical coupling with an exterior may be electrically coupled with the circuit block. The bonding pads 31 of the semiconductor chip 30 may include one or more bonding pads for data, one or more bonding pads for address, one or more bonding pads for clock signal, one or more bonding pads for control signal, one or more bonding pads for a power supply voltage, one or more bonding pads for a ground voltage, and so forth.

The dummy bonding pads 32 may be formed on the overhang portion OP and be configured by 2 to 4 bonding pads. In an embodiment, the bonding pads 31 may be arranged on the overhang portion OP to be lopsided in the (+)x direction. Further, the dummy bonding pads 32 may be successively arranged on the overhang portion OP in the (−)x direction, next to the bonding pad 31 which is positioned outermost when viewed in the (−)x direction among the bonding pads 31. FIG. 1 also illustrates the (−)y direction.

The dummy bonding pads 32 are formed for bonding of dummy wires 51 as will be described below. In addition, the dummy bonding pads 32 are constructed not to exert a substantial influence on the operations of the semiconductor chip 30 and a product in which the semiconductor chip 30 is used. To this end, the dummy bonding pads 32 may be electrically disconnected from the semiconductor chip 30, and precisely, the circuit block of the semiconductor chip 30. In an embodiment, each of the dummy bonding pads 32 may be formed to be electrically coupled with one or more bonding pads for a power supply voltage or one or more bonding pads for a ground voltage among the bonding pads 31 of the semiconductor chip 30.

Although it is illustrated in the embodiment that the bonding pads 31 and the dummy bonding pads 32 are arranged in one line, it is to be noted that the bonding pads 31 and the dummy bonding pads 32 may be arranged in at least two lines.

Figure 2:
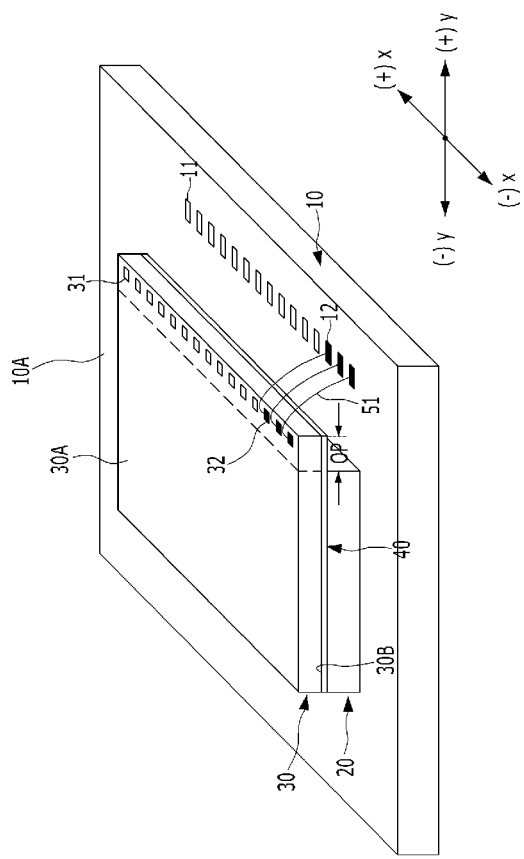

Referring to FIG. 2, the dummy wires 51, which electrically couple the dummy bonding pads 32 and the dummy bond fingers 12, are formed through a wire bonding process using a capillary of a bonding tool (not shown).

Figure 3:
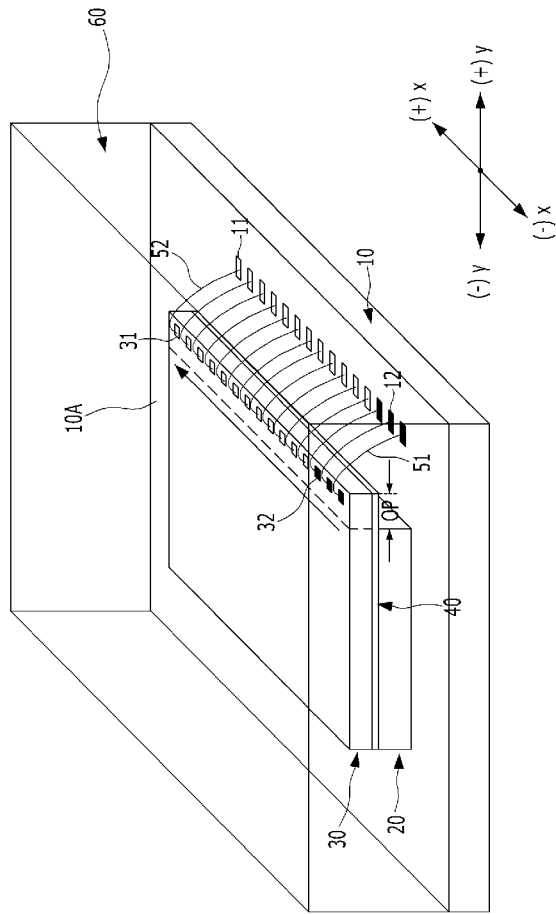

Referring to FIG. 3, after forming the dummy wires 51, conductive wires 52, which electrically couple the bonding pads 31 and the bond fingers 11, are formed through a wire bonding process using a capillary. The wire bonding process to form the conductive wires 52 may be performed in the direction facing away from the dummy bonding pads 32, starting from the bonding pad 31 positioned next to the dummy bonding pads 32. In an embodiment, the wire bonding process may be performed successively in the arrangement order of the bonding pads 31 in the (+)x direction, or, in the order defined according to the direction indicated by the arrow shown in FIG. 3.

The dummy wires 51 and the conductive wires 52 may be formed of the same material. The material, may be any one of, for example, aluminum (Al), copper (Cu), silver (Ag), gold (Au) and an alloy thereof.

While performing the wire bonding process for forming the dummy wires 51, a deflection phenomenon may occur in which the overhang portion OP of the semiconductor chip 30 is deflected up and down by the pressing force of a capillary. Accordingly, one or more of the dummy wires 51 may not be bonded to the dummy bonding pads 32. However, the dummy bonding pads 32 do not exert a substantial influence on the operations of the semiconductor chip 30 and a product in which the semiconductor chip 30 is used.

In the wire bonding process to form the conductive wires 52, as the pressing force of a capillary is offset by the tensile force of the dummy wires 51 bonded to the dummy bonding pads 32, deflection is suppressed. Accordingly, the conductive wires 52 may be firmly bonded to the bonding pads 31. In brief, the occurrence of a bonding fail in the conductive wires 52 due to the deflection may be suppressed as a result.

A molding part 60 is formed on the one surface 10A of the substrate 10 to cover the structural body 20, the semiconductor chip 30, the dummy wires 51 and the conductive wires 52. In addition, external connection electrodes such as solder balls are formed on the electrode pads formed on the other surface of the substrate 10.

Hereafter, the structure of the semiconductor package manufactured by the method mentioned above will be described.

Referring again to FIG. 3, the semiconductor package in accordance with an embodiment may include the substrate 10, the structural body 20, the semiconductor chip 30, the plurality of bonding pads 31, the plurality of dummy bonding pads 32, the dummy bonding wires 51, and the bonding wires 52. The semiconductor package in accordance with an embodiment may further include the molding part 60.

The substrate 10 may be a printed circuit board (PCB). The substrate 10 may have the plurality of bond fingers 11 and the plurality of dummy bond fingers 12 on the one surface 10A thereof. The bond fingers 11 may include one or more bond fingers for data, one or more bond fingers for address, one or more bond fingers for clock signal, one or more bond fingers for control signal, one or more bond fingers for a power supply voltage, one or more bond fingers for a ground voltage, and so forth. Each of the dummy bond fingers 12 may be electrically coupled with any one of the one or more bond fingers for a power supply voltage and the one or more bond fingers for a ground voltage. In addition, each of the dummy bond fingers 12 may be supplied with a power supply voltage or a ground voltage from the one or more bond fingers for a power supply voltage or the one or more bond fingers for a ground voltage. The dummy bond fingers 12 may not be electrically coupled with the bond fingers 11, and be electrically floated.

The plurality of electrode pads may be formed on the other surface of the substrate 10 which faces away from the one surface 10A. The substrate 10 may include the circuit wiring lines which electrically couple the bond fingers 11 formed on the one surface 10A and the electrode pads formed on the other surface.

Although an embodiment illustrates an example in which the substrate 10 is a printed circuit board, it is to be noted that the technical sprit of the embodiment is not limited to such an example. For example, the substrate 10 may be any one of a lead frame, a flexible substrate and an interposer or the like.

The structural body 20 may be disposed over the one surface 10A of the substrate 10.

The structural body 20 may be at least any one of an insulator such as a solder resist film, a semiconductor chip and a dummy chip. In an embodiment, it is illustrated that the structural body 20 is constructed by a solder resist film. While not shown, where the structural body 20 is a semiconductor chip, the semiconductor chip may be electrically coupled with the substrate 10. In order for an electrical coupling with the substrate 10, the semiconductor chip may have a plurality of bumps on the front surface on which bonding pads are disposed. Further, the semiconductor chip may be flip chip-bonded onto the one surface 10A of the substrate 10 by the medium of the bumps. The semiconductor chip may be attached onto the one surface 10A of the substrate 10 by the medium of an adhesive member. In addition, the semiconductor chip may be electrically coupled with the substrate 10 by the medium of conductive wires. Where the structural body 20 is a dummy chip, the dummy chip may be attached onto the one surface 10A of the substrate 10 by the medium of an adhesive member.

The semiconductor chip 30 may have the front surface 30A on which the circuit block is disposed and the back surface 30B which faces away from the front surface 30A.

The circuit block may be formed to a partial depth of the semiconductor chip 30 from the front surface 30A of the semiconductor chip 30. The circuit block may also include a semiconductor memory device or/and a semiconductor logic device. The circuit block may also be configured by an integrated circuit, in which individual elements, such as transistors, resistors, capacitors, fuses, and so forth, necessary for the operation of a chip are electrically coupled with one another.

The bonding pads 31 may be formed adjacent to and along one edge on the front surface 30A of the semiconductor chip 30. The bonding pads 31 as the external contacts of the circuit block for electrical coupling with an exterior may be electrically coupled with the circuit block.

The adhesive member 40 may be formed on the back surface 30B of the semiconductor chip 30. The semiconductor chip 30 may be attached onto the structural body 20 by the medium of the adhesive member 40 such that one edge portion of the semiconductor chip 30, on which the plurality of bonding pads 31 are positioned, projects out of the side surface of the structural body 20 in the (+)y direction defined in FIG. 3. In particular, the semiconductor chip 30 may have the overhang portion OP which projects out of the side surface of the structural body 20. Further, the plurality of bonding pads 31 may be disposed on the overhang portion OP.

The dummy bonding pads 32 may be formed on the overhang portion OP, and be configured by 2 to 4 bonding pads. In an embodiment, the bonding pads 31 may be arranged on the overhang portion OP to be lopsided in the (+)x direction. In addition, the dummy bonding pads 32 may be successively arranged on the overhang portion OP in the (−)x direction, next to the bonding pad 31 which is positioned outermost when viewed in the (−)x direction, among the bonding pads 31.

The dummy bonding pads 32 are formed for bonding of the dummy wires 51. The dummy bonding pads 32 are also constructed not to exert a substantial influence on the operations of the semiconductor chip 30 and a product in which the semiconductor chip 30 is used. To this end, the dummy bonding pads 32 may be electrically disconnected from the semiconductor chip 30, precisely, the circuit block of the semiconductor chip 30. Each of the dummy bonding pads 32 may be formed to be electrically coupled with any one of the one or more bonding pads for a power supply voltage or the one or more bonding pads for a ground voltage among the bonding pads 31 of the semiconductor chip 30.

The dummy wires 51 may be electrically coupled between the dummy bonding pads 32 and the dummy bond fingers 12. In addition, the conductive wires 52 may be electrically coupled between the bonding pads 31 and the bond fingers 11 to electrically couple the bonding pads 31 and the bond fingers 11. The dummy wires 51 and the conductive wires 52 may be formed of the same material. As the material, any one of, for example, aluminum (Al), copper (Cu), silver (Ag), gold (Au) and an alloy thereof may be used.

The molding part 60 may be formed on the one surface 10A of the substrate 10 to cover the structural body 20, the semiconductor chip 30, the dummy wires 51 and the conductive wires 52. Although not shown, the external connection electrodes such as solder balls may be formed on the electrode pads formed on the other surface of the substrate 10.

An embodiment described above with reference to FIGS. 1 to 3 illustrates an example in which the bonding pads 31 are arranged on the overhang portion OP to be lopsided in the (+)x direction and the dummy bonding pads 32 are successively arranged on the overhang portion OP in the (−)x direction, next to the bonding pad 31 which is positioned outermost when viewed in the (−)x direction, among the bonding pads 31. However, it is to be noted that an embodiment is not limited to such an example and changes may be made to various shapes. Such modified embodiments will be apparent from the following descriptions which will be made with reference to FIGS. 4 and 5.

In the following descriptions, repeated descriptions for the same component elements as those of the embodiment described above with reference to FIGS. 1 to 3 will be omitted. In addition, the same terms and the same reference numerals will be used to refer to the same or like component elements.

Figure 4:
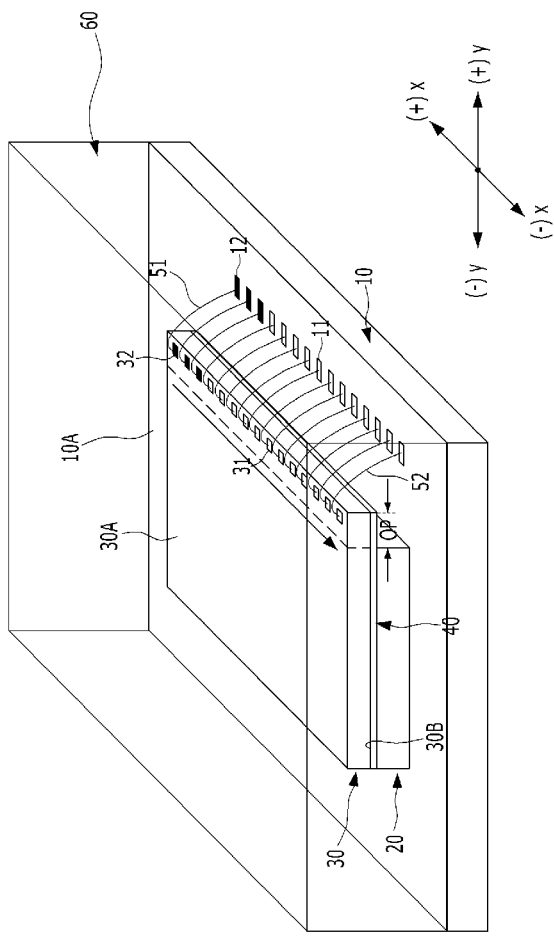
FIG. 4 is a perspective view illustrating a representation of an example of a semiconductor package in accordance with an embodiment.

Referring to FIG. 4, the bonding pads 31 may be arranged on the overhang portion OP to be lopsided in the (−)x direction. In addition, the dummy bonding pads 32 may be successively arranged on the overhang portion OP in the (+)x direction, next to the bonding pad 31 which is positioned outermost when viewed in the (+)x direction, among the bonding pads 31. In this case, the wire bonding process to form the conductive wires 52 may be performed in the (−)x direction facing away from the dummy bonding pads 32, starting from the bonding pad 31 positioned next to the dummy bonding pads 32, after forming the dummy wires 51 which electrically couple the dummy bonding pads 32 and the dummy bond fingers 12. In an embodiment, the wire bonding process may be performed successively in the arrangement order of the bonding pads 31 in the (−)x direction, or, in the order defined according to the direction indicated by the arrow shown in FIG. 4, starting from the bonding pad 31 positioned closest to the dummy bonding pads 32.

Figure 5:
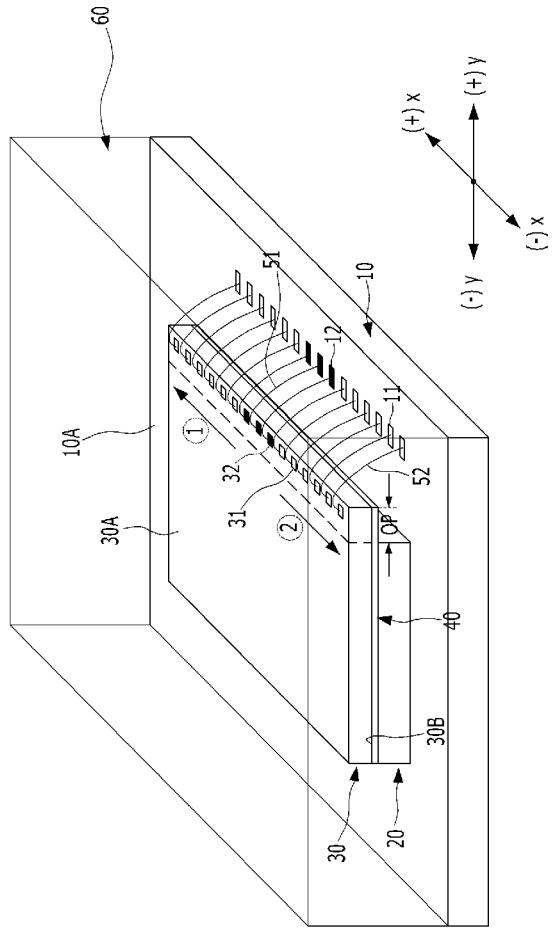
FIG. 5 is a perspective view illustrating a representation of an example of a semiconductor package in accordance with an embodiment.

Referring to FIG. 5, the dummy bonding pads 32 may be arranged between the bonding pads 31. In detail, the dummy bonding pads 32 may be successively arranged at the center portion of the overhang portion OP. In addition, the bonding pads 31 may be arranged on the overhang portion OP on both sides of the dummy bonding pads 32. In this case, the wire bonding process for forming the conductive wires 52 may be performed such that the conductive wires 52 are successively formed according to the arrangement order of the bonding pads 31 in each direction facing away from the dummy bonding pads 32, starting from the bonding pad 31 positioned next to the dummy bonding pads 32, after forming the dummy wires 51 which electrically couple the dummy bonding pads 32 and the dummy bond fingers 12. In an embodiment, after forming the dummy wires 51 which electrically couple the dummy bonding pads 32 and the dummy bond fingers 12, the wire bonding process for forming the conductive wires 52 may be performed successively in the arrangement order of the bonding pads 31 according to the (+)x direction, or, in order according to the direction indicated by the arrow shown in FIG. 5, starting from the bonding pad 31 positioned closest to the dummy bonding pads 32 in the (+)x direction. Further, the wire bonding process then, may be performed successively in the arrangement order of the bonding pads 31 according to the (−)x direction, or, in order according to the direction indicated by the arrow shown in FIG. 5, starting from the bonding pad 31 positioned closest to the dummy bonding pads 32 in the (−)x direction. On the contrary, in an embodiment, after forming the dummy wires 51 which electrically couple the dummy bonding pads 32 and the dummy bond fingers 12, the wire bonding process for forming the conductive wires 52 may be performed successively in the arrangement order of the bonding pads 31 according to the (−)x direction, or, in order according to the direction indicated by the arrow shown in FIG. 5, starting from the bonding pad 31 positioned closest to the dummy bonding pads 32 in the (−)x direction. Further, the wire bonding process may then, may be performed successively in the arrangement order of the bonding pads 31 according to the (+)x direction, or, in order according to the direction indicated by the arrow shown in FIG. 5, starting from the bonding pad 31 positioned closest to the dummy bonding pads 32 in the (+)x direction.

Although it is illustrated, as an example, in the embodiments described above with reference to FIGS. 1 to 5 that the dummy bonding pads 32 are arranged successively, it is to be noted that the embodiments are not limited to such an example. In other words, the dummy bonding pads 32 may not be successively arranged. In addition, 1 or 2 bonding pads 31 may be interposed between the dummy bonding pads 32.

According to various embodiments, dummy wires, which connect a semiconductor chip and a substrate, are formed before forming conductive wires which electrically couple the semiconductor chip and the substrate. As a result, since the pressing force of a capillary may be offset by the tensile force of the dummy wires when bonding the conductive wires to the semiconductor chip, it is possible to prevent the overhang portion of the semiconductor chip from being deflected up and down. Accordingly, the occurrence of a bonding fail in a conductive wire due to the deflection may be suppressed. Further, the manufacturing yield may be improved.

Figure 6A:
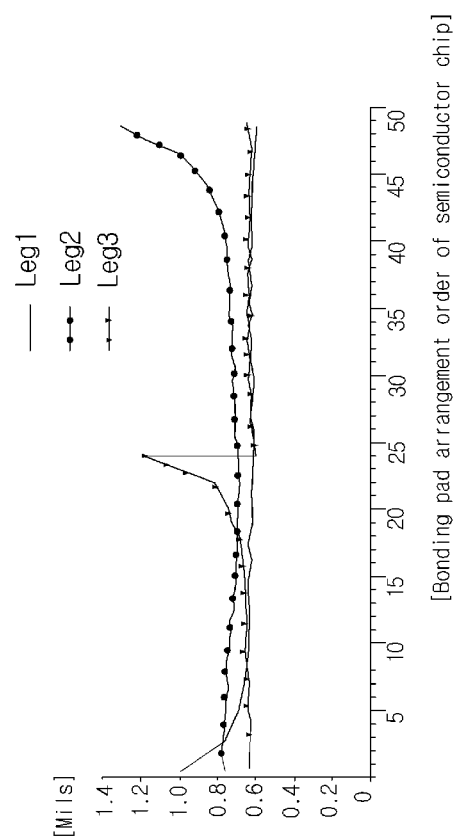
FIG. 6A is a graph obtained by measuring and recording, by examples, the values of deflection of the overhang portion of a semiconductor chip that occurs during a wire bonding process.
Figure 6B:
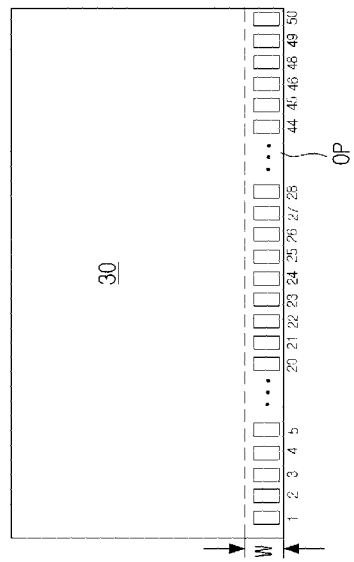
FIG. 6B is a plan view illustrating a representation of an example of a semiconductor chip used in the test of FIG. 6A.

Referring to FIG. 6A, a graph obtained by measuring and recording, by examples, the values of deflection of the overhang portion of a semiconductor chip that occurs during a wire bonding process for a test is illustrated. Referring to FIG. 6B, a plan view illustrating a representation of an example of a semiconductor chip used in the test is also illustrated.

The thickness of the semiconductor chip 30 used in the test is 42 μm. In addition, the projecting width W of the overhang portion OP of the semiconductor chip 30 is 900 μm.

Leg1 is a graph obtained by measuring and recording deflection values while performing a wire bonding process successively in the arrangement order of bonding pads from the first bonding pad positioned adjacent to one end of the overhang portion OP to the fiftieth bonding pad positioned adjacent to the other end of the overhang portion OP. Leg2 is a graph obtained by measuring and recording deflection values while performing a wire bonding process successively in the arrangement order of bonding pads from the fiftieth bonding pad to the first bonding pad. In addition, Leg3 is a graph obtained by measuring and recording deflection values while performing a wire bonding process successively in the arrangement order of bonding pads from the twenty-fourth bonding pad positioned at the center of the overhang portion OP to the first bonding pad and then performing a wire bonding process successively in the arrangement order of bonding pads from the twenty-fifth bonding pad to the fiftieth bonding pad.

In the case of Leg1, it may be seen that deflection largely occurs in the first to third bonding pads for which wire bonding is initially carried out, then gradually decreases and does not substantially occur in the fifth to fiftieth bonding pads. In the case of Leg2, it may be seen that deflection largely occurs in the fiftieth to forty-eighth bonding pads for which wire bonding is initially carried out, then gradually decreases and does not substantially occur in the forty-fifth to first bonding pads. In the case of Leg3, it may be seen that deflection largely occurs in the twenty-fourth to twenty-first bonding pads for which wire bonding is initially carried out, then gradually decreases and does not substantially occur in the nineteenth to first bonding pads and the twenty-fifth to fiftieth bonding pads. In brief, it may be seen that, while deflection largely occurs in 1 to 4 bonding pads for which wire bonding is initially carried out, deflection is suppressed by the tensile force of previously formed wires when subsequently performing wire bonding. Through such an experiment result, it may be seen that, while deflection occurs in the semiconductor chip 30 when forming the dummy wires 51 in the above-described embodiments, deflection is suppressed by the tensile force of the dummy wires 51 when forming the conductive wires 52.

The above-described semiconductor package may be applied to various semiconductor devices and package modules or the like.

Figure 7:
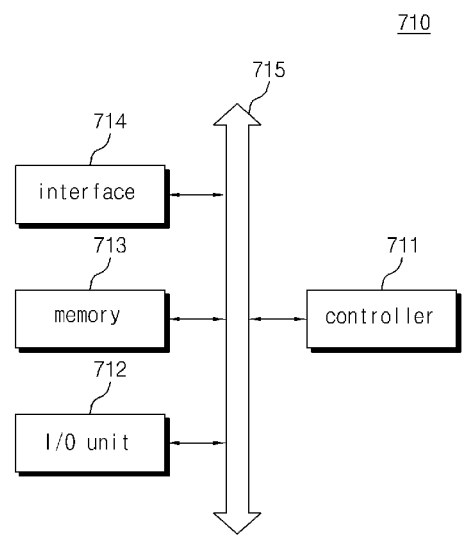
FIG. 7 is a block diagram showing a representation of an example of an electronic system which includes the semiconductor package in accordance with various embodiments.

Referring to FIG. 7, the semiconductor package in accordance with various embodiments described above may be applied to an electronic system 710. The electronic system 710 may include a controller 711, an input/output unit 712, and a memory 713. The controller 711, the input/output unit 712 and the memory 713 may be electrically coupled with one another through a bus 715 which provides a data movement path.

For example, the controller 711 may include at least one microprocessor, at least one digital signal processor, at least one microcontroller, and at least one of logic circuits capable of performing the same functions as these components. The memory 713 may include at least one among the semiconductor packages in accordance with various embodiments.

The input/output unit 712 may include at least one selected among a keypad, a keyboard, a display device, a touch screen, and so forth. The memory 713 as a device to store data may store data or/and commands to be executed by the controller 711 or the like.

The memory 713 may include a volatile memory device such as a DRAM or/and a nonvolatile memory device such as a flash memory. For example, a flash memory may be mounted to an information processing system such as a mobile terminal or a desk top computer. The flash memory may be configured as a solid state drive (SSD). In this case, the electronic system 710 may stably store a large amount of data in a flash memory system.

The electronic system 710 may further include an interface 714 which is set to be able to transmit and receive data to and from a communication network. The interface 714 may be a wired or wireless type. For example, the interface 714 may include an antenna, a wired transceiver or a wireless transceiver.

The electronic system 710 may be understood as a mobile system, a personal computer, a computer for an industrial use or a logic system which performs various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system or the like.

Where the electronic system 710 is a device capable of performing wireless communication, the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 8:
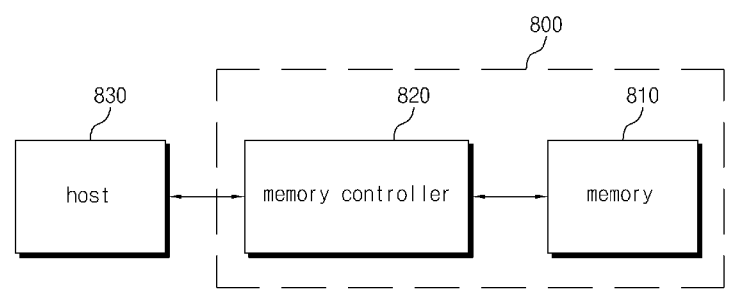
FIG. 8 is a block diagram showing a representation of an example of a memory card which includes the semiconductor package in accordance with various embodiments.

Referring to FIG. 8, the semiconductor package in accordance with various embodiments may be provided in the form of a memory card 800. For example, the memory card 800 may include a memory 810 such a nonvolatile memory device and a memory controller 820. The memory 810 and the memory controller 820 may store data or read stored data.

The memory 810 may include at least any one among nonvolatile memory devices to which the semiconductor package in accordance with the embodiments is applied. In addition, the memory controller 820 may control the memory 810 to read stored data or store data in response to a read/write request from a host 830.

While various embodiments have been described above, it will be understood to those skilled in the art that the embodiments described are by way of examples only. Accordingly, the semiconductor package having an overhang portion and the method for manufacturing the same described should not be limited based on the described embodiments above.

What is claimed is:

1. A method for manufacturing a semiconductor package, comprising:
    disposing a structural body over one surface of a substrate, the substrate formed with a plurality of bond fingers and a plurality of dummy bond fingers;
    forming an overhang portion by stacking a semiconductor chip formed with a plurality of bonding pads and a plurality of dummy bonding pads positioned on the overhead portion and adjacent to one edge over the structural body such that the one edge projects out of a side surface of the structural body;
    forming a plurality of dummy wires which electrically couple the plurality of dummy bonding pads and the plurality of dummy bond fingers respectively;
    forming a plurality of conductive wires which electrically couple the plurality of bonding pads and the plurality of bond fingers respectively after the plurality of dummy wires are formed, and wherein the plurality of dummy bonding pads are successively arranged between the plurality of bonding pads and the forming of the plurality of conductive wires is performed such that the plurality of respective conductive wires are successively formed according to an arrangement order of a first plurality of bonding pads disposed on one side of the plurality dummy bonding pads, starting from one of the plurality of bonding pads positioned nearest to the one side of the first plurality of dummy bonding pads, and the plurality of respective conductive wires are successively formed according to another arrangement order of a second plurality of the bonding pads disposed on another side of the plurality of dummy bonding pads, starting from one of the plurality of bonding pads positioned nearest to the another side of the second plurality of dummy bonding pads.

2. The method according to claim 1, wherein the plurality of dummy bonding pads are successively arranged on the overhang portion.

3. The method according to claim 1, wherein the plurality of dummy bonding pads are electrically disconnected from the semiconductor chip.

4. The method according to claim 1, wherein each of the plurality of dummy bonding pads are electrically coupled with any one of one or more bonding pads of the plurality of bonding pads for a power supply voltage and one or more bonding pads of the plurality of bonding pads for a ground voltage.

5. The method according to claim 1, wherein the plurality of dummy bonding pads are successively arranged outside of the bonding pad located at an end of the plurality of bonding pads.

6. The method according to claim 1, wherein the forming of the plurality of conductive wires is performed such that the plurality of conductive wires are successively formed in a direction facing away from the plurality of dummy bonding pads starting from one of the bonding pads among the plurality of bonding pads positioned next to a dummy bonding pad positioned at an end of the plurality of dummy bonding pads.

7. The method according to claim 1, wherein the plurality of dummy bonding pads are arranged by a number of 2 to 4.

8. The method according to claim 1, wherein the structural body comprises at least any one of an additional semiconductor chip, a dummy chip and an insulator.

9. The method according to claim 1, wherein each of the plurality of dummy bond fingers is electrically coupled with any one of the one or more bond fingers of the plurality of bond fingers for a ground voltage and the one or more bond fingers of the plurality of bond fingers for a power supply voltage.

10. The method according to claim 1, wherein the plurality of dummy bond fingers are electrically floated.

11. The method according to claim 1, wherein the plurality of dummy wires are formed of a same material as that of the plurality of conductive wires.

* * * * *